United States Patent [19]

Sun et al.

[11] Patent Number: 5,279,990
[45] Date of Patent: Jan. 18, 1994

[54] METHOD OF MAKING A SMALL GEOMETRY CONTACT USING SIDEWALL SPACERS

[75] Inventors: Shih W. Sun; Michael P. Woo, both of Austin, Tex.

[73] Assignee: Motorola, Inc., Schaumburg, Ill.

[21] Appl. No.: 31,085

[22] Filed: Mar. 12, 1993

Related U.S. Application Data

[63] Continuation of Ser. No. 487,336, Mar. 2, 1990, abandoned.

[51] Int. Cl.$^5$ ............................................. H01L 21/44
[52] U.S. Cl. ........................... 437/195; 437/203; 437/228
[58] Field of Search .......................... 437/195, 203, 228

[56] References Cited

U.S. PATENT DOCUMENTS

| | | | |
|---|---|---|---|
| 3,801,383 | 4/1974 | Yamada et al. | 437/164 |
| 3,922,184 | 11/1975 | Baker et al. | 437/228 |
| 4,256,514 | 3/1981 | Pogge | 148/1.5 |
| 4,619,037 | 10/1986 | Taguchi et al. | 437/195 |
| 4,774,206 | 9/1988 | Willer | 437/203 |
| 4,792,534 | 12/1988 | Tsuji et al. | 437/229 |
| 4,801,350 | 1/1989 | Mattox et al. | 156/643 |
| 4,879,254 | 11/1989 | Tsuzuki et al. | 437/203 |
| 4,889,827 | 12/1989 | Willer | 437/203 |
| 4,892,835 | 1/1990 | Rabinzoha et al. | 437/184 |
| 4,916,083 | 4/1990 | Monkowski et al. | 437/203 |
| 4,939,100 | 7/1990 | Jeuch et al. | 437/203 |
| 4,977,105 | 12/1990 | Okamoto et al. | 437/195 |
| 5,084,416 | 1/1992 | Ozaki et al. | 437/195 |

FOREIGN PATENT DOCUMENTS

| | | | |
|---|---|---|---|
| 0008928 | 8/1978 | European Pat. Off. | 437/203 |
| 61-099681 | 5/1986 | Japan. | |

Primary Examiner—Brian E. Hearn
Assistant Examiner—Laura M. Holtzman
Attorney, Agent, or Firm—James L. Clingan, Jr.; George R. Meyer

[57] ABSTRACT

A contact between a heavily-doped region in the substrate and metal is made via a hole in a thick oxide layer and a polysilicon layer. The polysilicon layer is first etched to form a hole for establishing a mask for the eventual contact hole. Prior to forming the contact hole, a sidewall spacer of polysilicon is formed in the hole in the polysilicon layer. A thin oxide layer over the polysilicon layer is used for convenient end point detection during the formation of the polysilicon sidewall spacers. The sidewall spacer reduces the bore dimension of the hole in the polysilicon used for the mask for forming the contact hole. A hole is then etched in the thick oxide which is sloped and which has a bore dimension determined by the hole in the polysilicon which is reduced due to the sidewall spacer. The heavily-doped region, the contact hole, and the remaining polysilicon are coated with a barrier. The contact hole is then filled with a conductive material which also coats the barrier. The resulting conductive material, barrier, and polysilicon, are conveniently selectively etched in a single process step. The contact adheres well because polysilicon is in contact with the thick oxide in the locations where there is going to applied any physical stress, such as a bonding pad.

15 Claims, 3 Drawing Sheets

METHOD OF MAKING A SMALL GEOMETRY CONTACT USING SIDEWALL SPACERS

This is a continuation of prior application Ser. No. 07/487,336, filed Mar. 2, 1990, now abandoned.

FIELD OF THE INVENTION

The invention relates to integrated circuit device structures, and more particularly, to contact device structures and methods for integrated circuits.

BACKGROUND OF THE INVENTION

In small geometry integrated circuit process technology, such as 0.5 micron or below, one of the problems is that the etching of a hole causes the hole that is etched to be larger than the mask dimension for a positive photoresist process. In the case of forming a polysilicon line, the photoresist is developed away to leave a line of photoresist of a line width which is somewhat less than the pattern on the mask which defined the photoresist line. The photoresist that remains is what determines the ultimate polysilicon width. In this case, the polysilicon that remains after etching the polysilicon layer using this photoresist as a mask is about 0.5 micron. The result is a polysilicon minimum dimension of 0.5 micron for a 0.5 micron technology. In the case of forming a contact, the hole that is to be made for the contact is derived from a pattern on a mask which is at about 0.55 micron for a 0.5 micron technology. This results in an exposure on the photoresist of about 0.60 micron. The photoresist, however, when developed, leaves a hole of about 0.65 micron so that the effect of the exposure of a 0.55 micron pattern on the mask is to leave a hole in the photoresist of 0.65 micron. The photoresist acts as a mask for the underlying oxide which, when etched by a mask with a hole of 0.65 micron, results in a hole of about 0.75 micron due to the activity of the etch material itself. Even though the etch may be a reactive ion etch (RIE), the walls of the oxide are expanded about another tenth of a micron. Thus, the contact hole is 0.25 microns wider than the minimum polysilicon width that is obtained.

In aligning the contact to a heavily-doped region in the substrate, however, there is a much wider area that must be allotted for the contact alignment than is actually necessary to obtain a good electrical contact. The width of the contact does reduce the resistivity of the contact, but the resistivity of the contact material itself is so low in relation to the other resistances in the path that any extra resistance due reducing the contact size is of no consequence. A much smaller diameter contact would work equally well electrically. The large contact hole may mean that the diffused areas in the substrate to which the contact is made have to be larger than they would have to be otherwise. It means that other circuit elements have to be further removed from contact holes than they would have to be otherwise. All of which cause the integrated circuit to be less dense, the overall integrated circuit larger, and thus decreases the number of potential die on a particular wafer and in some cases making the die too large to fit into some industry standard package. The desirability of smaller die size is well known and there are numerous reasons for it.

SUMMARY OF THE INVENTION

Accordingly, it is an object of the present invention to provide an improved electrical contact in an integrated circuit.

Another object of the invention is to provide an improved method for making an electrical contact in an integrated circuit.

These and other objects are achieved in a device structure for making contact to a surface of a doped region in a substrate. There is a layer of insulating material which has a top surface and a bottom surface overlying the doped region with a hole therein from the top surface to the bottom surface to expose a portion of the surface of the doped region. There is a polysilicon layer over the insulating material with a hole therein. The hole in the polysilicon layer is coterminous with the hole in the insulating layer at the top surface of the insulating layer. There is a conductive material in the hole in the insulating layer, in the hole in the polysilicon layer, over the polysilicon layer, and makes electrical contact to the portion of the surface of the doped region.

DETAILED DESCRIPTION OF THE INVENTION

Figure 1:
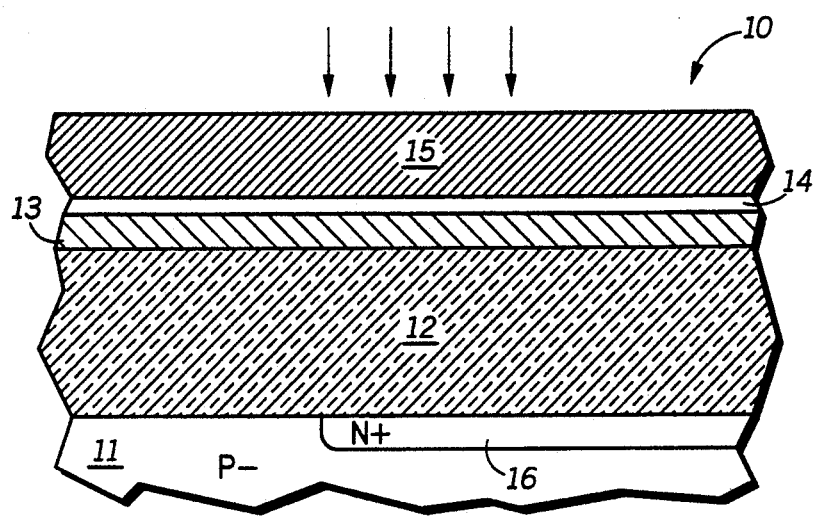
FIGS. 1-8 are cross-sections of a device structure at consecutive stages of processing according to a preferred embodiment of the invention.

Shown in FIG. 1 is an integrated device structure 10 comprised of a substrate 11, an oxide insulating layer 12 overlying substrate 11, a polysilicon layer 13 overlying insulating layer 12, a thin oxide layer 14 overlying polysilicon layer 13 and a photoresist layer 15 overlying oxide layer 14. Formed in substrate 11 is a heavily doped region 16. Substrate 11 in the preferred embodiment is shown as being doped to P−. The heavily-doped region 16 is shown as being N+. As used herein substrate 11 may include a well in a larger substrate not shown. Also the substrate 11 could just as easily be N− and heavily-doped region 16 could be P+. Heavily-doped region 16 might typically be a drain region or any extension of a drain region or some other contact point for some active element in a circuit, or it could be an extension of a power supply or any electrically functional element in a circuit that needs contact to an upper layer, especially a metal layer in the integrated circuit. The arrows pointing down on photoresist layer 15 indicate an exposure via a mask as is conventional in processing integrated circuits. The width of this is about 0.55 micron, the exposed portion of photoresist layer 15 will subsequently be developed away. Oxide layer 14 is quite thin, about 200 Angstroms. Oxide layer 14 can also be some other convenient thickness. Polysilicon layer 13 is about 1500 Angstroms in thickness. Oxide layer 12, which is a reflow glass and which in the present embodiment is boro-phospho-silicate glass (BPSG), is about 6000 Angstroms in thickness.

Figure 2:
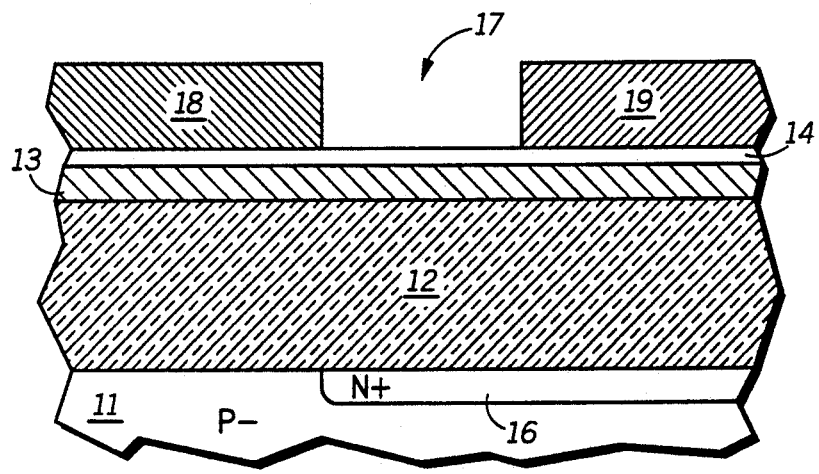
Figure 3:
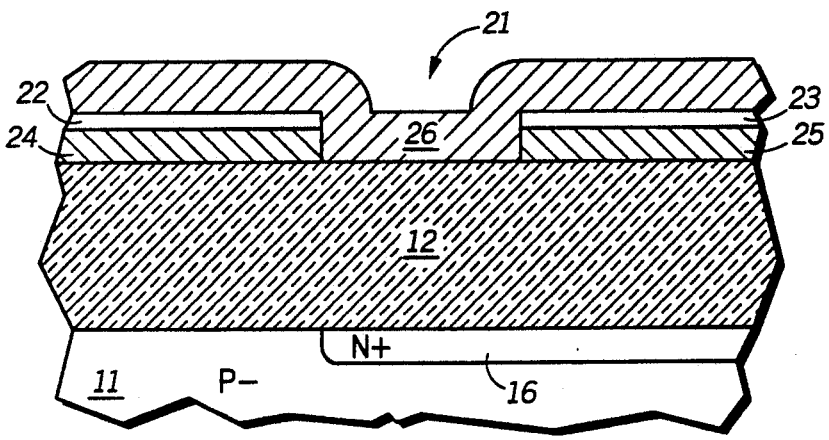

Shown in FIG. 2 is the result of developing away the exposed portion of positive photoresist layer 15 leaving a hole of a bore dimension of about 0.65 micron, which is about 0.1 micron greater than the bore dimension of the mask which was used to irradiate photoresist layer 15 for the purpose of selecting which portion of photoresist 15 would be removed. The washing away of the exposed portion of photoresist layer 15 leaves a hole 17 surrounded by the remaining portion of photoresist layer 15. This remaining portion is shown in two portions in FIG. 2 on either side of the cross section through hole 17. There is shown a photoresist portion 18 and a photoresist portion 19. Photoresist portions 18 and 19 surround hole 17. Hole 17 would typically be circular but may have an irregular shape. The shape on the mask which is used to expose the photoresist is typically square. The bore dimension is the dimension across the hole taken at a center cross section. Forming hole 17 exposes a portion of oxide layer 14 which is subsequently etched. The result of this etch is shown in FIG. 3.

Figure 4:
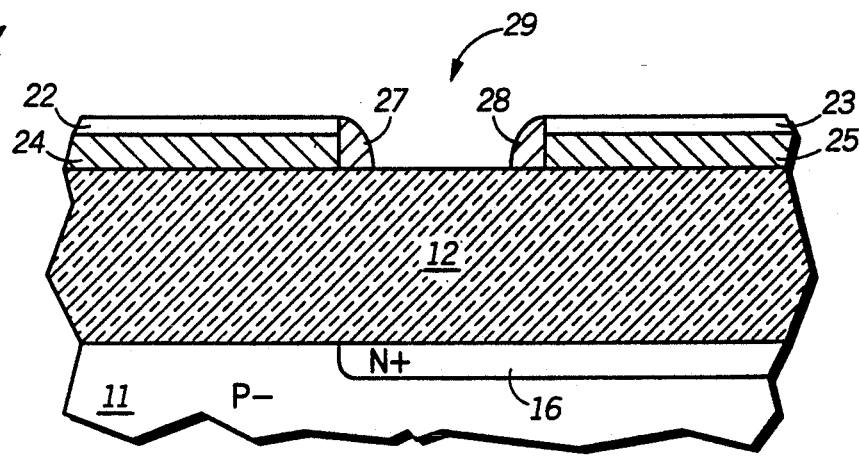

After oxide layer 14 and polysilicon layer 13 are etched, photoresist portions 18 and 19 are removed. This leaves a hole 21 in oxide layer 14 and polysilicon layer 13 which is substantially coterminous with hole 17. Due to the etching process, hole 21 is not likely to be exactly coterminous with hole 17 but may have a slightly greater bore dimension. The remaining portions of oxide layer 14 and polysilicon layer 13 surround hole 21. Shown in cross section FIG. 3 remaining portion of oxide layer 14 is shown as a portion 22 and a portion 23, and polysilicon layer 13 which remains is shown as portions 24 and 25. Subsequent to the formation of hole 21 and the removal of the remaining portion of photoresist layer 15, a polysilicon layer 26 is deposited over oxide portions 22 and 23 and in hole 21 on an exposed portion of oxide layer 12. The exposed portion of oxide layer 12 is coterminous with hole 21. Polysilicon layer 26 is very conformal because that is the nature of polysilicon when deposited. Amorphous silicon could also be considered for this purpose. Polysilicon layer 26 is then etched anisotropically to form a sidewall spacer inside hole 21. Oxide layer portions 22 and 23 are used for end point detection so that the sidewall spacer that is formed inside hole 21 is very precisely controlled. After the portion of polysilicon layer 26 which is over oxide portions 22 and 23 is etched sufficiently to expose oxide portions 22 and 23 end point detection can be done conventionally. A slight over etch is then done to ensure that all polysilicon is removed over oxide portions 22 and 23. This oxide comprised of portions 22 and 23 allows for very good control of the polysilicon sidewall spacers. The polysilicon sidewall spacer is continuous inside hole 21. In cross section this is shown as two portions of sidewall spacer. Shown in FIG. 4 there is then a sidewall spacer 27 and a sidewall spacer 28. With sidewall spacers 27 and 28, hole 21 has a significantly reduced bore dimension to form a hole 29 with a bore dimension of about 0.4 micron. Hole 29 thus exposes a reduced portion of oxide layer 12.

Figure 5:
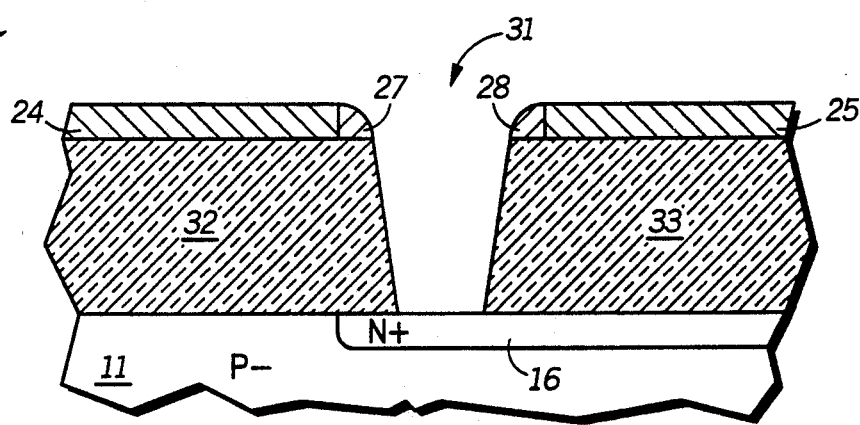
Figure 6:
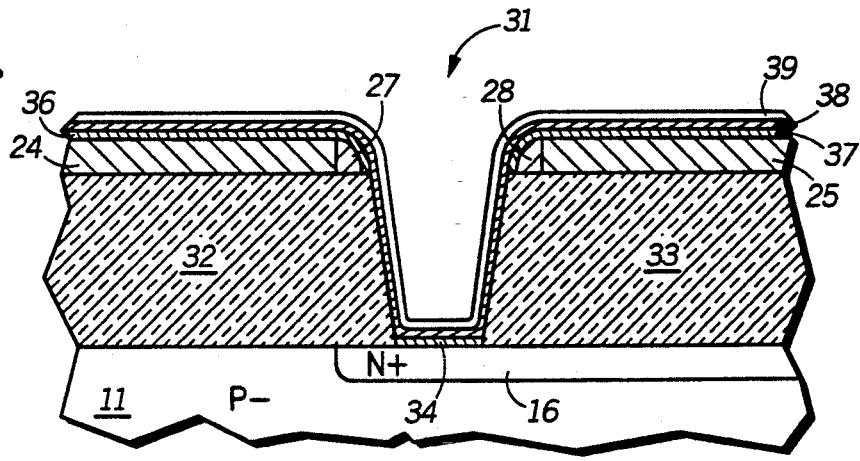

The exposed portion of oxide layer 12 is then anisotropically etched all the way to heavily doped region 16, this etch is achieved using conventional chemistry which has a high degree of selectivity between polysilicon and oxide. This selectivity is not perfect however, so that some of sidewall spacers 27 and 28 are etched during the etch of oxide layer 12 this desirably leaves a slope to the sides of oxide layer 12. This allows for better step coverage than is achievable if the walls are perfectly vertical. As shown in FIG. 5 there is thus a hole 31 through oxide layer 12. The portion of hole 31 at the top surface of oxide layer 12 which was exposed to this etch is thus substantially coterminous with hole 29. Due to the small amount of etching that is done to sidewall spacers 27 and 28, this portion of hole 31 at the top surface of oxide layer 12 thus has a slightly larger bore dimension than hole 29. The exposed portion of heavily-doped region 16 after the etch of oxide layer 12 has a smaller bore dimension, due to the slope of the sides of hole 31, than the bore dimension of hole 31 at the top surface of oxide layer 12. Oxide layer 12 which remains after the etch which causes hole 31, surrounds hole 31. Oxide layer 12 is shown in cross section as two portions, a portion 32 and a portion 33. After heavily-doped region 16 is exposed via hole 31, a titanium layer is deposited and thermally annealed which forms titanium silicide where there is exposed silicon. There is thus formed a titanium silicide layer 34 on the exposed portion of heavily-doped region 16. There is also formed a titanium silicide layer 36 over polysilicon portion 24 and sidewall spacer 27. A titanium silicide layer 37 is formed over sidewall spacer 28 and polysilicon portion 25. There is a titanium layer 38 which overlies titanium silicide layers 34, 36, and 37 also coats the walls of hole 31. A titanium nitride layer 39 is formed over titanium layer 38 as a result of a rapid thermal anneal (RTA) using nitrogen ($N_2$). Ammonia ($NH_3$) could be used instead of nitrogen. This is shown in FIG. 6. The titanium and titanium nitride are used as a barrier as is known in the art. Other barriers may also be used.

Figure 7:
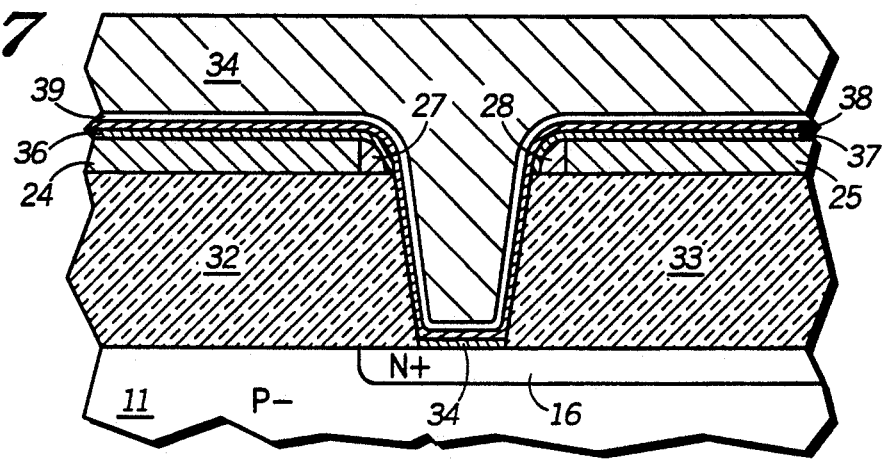

After the barrier formation shown in FIG. 6, a conductive fill material is deposited into hole 31 and over polysilicon portions 24 and 25 and over sidewall spacers 27 and 28. This conductive fill material as shown in FIG. 7 is aluminum. This conductive fill material 34 can also be a combination of materials equally well. For example, the conductive fill material may be a polysilicon plug which would be formed inside hole 31 and essentially be level with the top of polysilicon portions 24 and 25 and aluminum deposited over the top of titanium nitride layer 39 and over the polysilicon plug. The plug could also be tungsten instead of polysilicon. The particular conductive material that is chosen whether it be a combination of materials or a homogeneous material must be conductive in order to form the contact. After the formation of the conductive material in hole 31 and over polysilicon portions 24 and 25, conductive fill material 34 is selectively etched by gases comprising boron trichloride ($BCl_3$) silicon tetrachloride ($SiCl_4$) and chlorine ($Cl_2$). This combination of etchant gases is an effective etch for aluminum, titanium nitride, titanium silicide, and polysilicon. Consequently, the etching away of the conductive materials to leave only the desired contact is easily achieved in the single process step.

Figure 8:
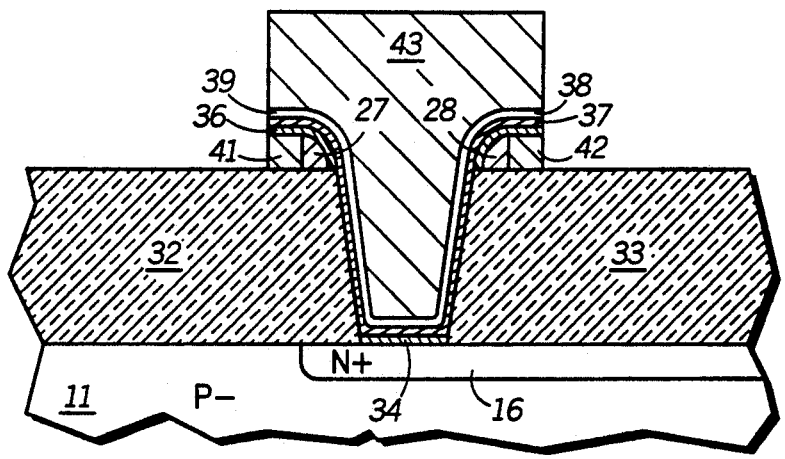

The device structure shown in FIG. 8 has several advantages over the typical contact formed in the prior art. A polysilicon portion 41 and 42 overlying oxide portions 32 and 33 respectively provide excellent adherence to oxide. If the barrier, as was in the prior art, is in direct contact with the doped oxide, and if there is pressure applied to the overlying aluminum, which would be true in the case of the aluminum providing a bonding pad, there is a tendency for the barrier of titanium and titanium nitride to lift away from the oxide. Titanium does not adhere nearly as well to oxide as does polysilicon. Thus the areas on an integrated circuit where there would be bonding pads which would provide an advantage by being less likely to lift away from the integrated circuit. There is also the advantage that the resulting contact dimension where contact is made to a heavily-doped region is substantially reduced. It can even be controllably reduced below the 0.5 micron benchmark for defining the particular technology. In typical contacts of the prior art the contact point to the heavily-doped region was significantly greater than the dimension that was used to describe the technology. The dimension that is used to describe the technology is generally the finest line that can be drawn, typically in polysilicon but may also be in a metal layer. Thus, for a technology that can define a 0.5 micron polysilicon gate length, the typical contact hole was greater than 0.5 micron, for example 0.75 micron. The contact hole shown in FIG. 8 which contacts heavily-doped region 16 can be controlled significantly below 0.5 micron. Contact dimensions contacting a heavily doped region have been made at less than 0.3 micron. As shown in FIG. 8, if the contact area to the N+ heavily-doped region 16 exceeded the original bore dimension of hole 21, there would actually be a short between substrate 11 and heavily doped-region 16. Thus it is seen that less area is required to form the contact at the surface of the substrate for the heavily-doped region, and the contact shown in FIG. 8 has less tendency to lift when used as a bonding pad because the underlying layer is polysilicon which contacts the insulating oxide instead of titanium being the material between the aluminum and the oxide. Because the contact hole is smaller, the minimum dimension for the metal which must surround the contact is also reduced. This also results in more efficient use of the available die area at the particular metal layer.

While the invention has been described in a specific embodiment, it will be apparent to those skilled in the art that the disclosed invention may be modified in numerous ways and may assume many embodiments other than those specifically set out and described above. For example, polysilicon layer 13 could be another conductive material, especially one which can be etched by the same gases as etch aluminum and which adheres well to BPSG, such as titanium nitride. Accordingly, it is intended by the appended claims to cover all modifications of the invention which fall within the true spirit and scope of the invention.

We claim:

1. A method of forming a contact for a semiconductor device comprising the steps of:
   providing a substrate having a primary surface and a doped region that lies at the primary surface;
   forming an insulating layer over the substrate;
   forming a polysilicon layer on the insulating layer;
   forming an oxide layer over the polysilicon layer, wherein a combination of the polysilicon and oxide layers has a combined thickness, and wherein the insulating layer is thicker than the combined thickness;
   forming a photoresist layer over the oxide layer;
   removing a portion of the photoresist layer to form a first hole, which extends through the photoresist layer and exposes a portion of the oxide layer;
   etching a second hole, which extends through the oxide layer and is aligned with the first hole;
   etching a third hole, which extends through the polysilicon layer and is aligned with the second hole, said third hole having a bore dimension;
   removing the photoresist layer;
   forming a sidewall spacer in the third hole to reduce the bore dimension within the third hole thereby forming a reduced-bore third hole, which lies within the third hole, wherein the sidewall spacer includes polysilicon;
   etching a fourth hole, wherein the fourth hole: is aligned with the bottom of the reduced-bore third hole; extends through the insulating layer to the doped region; and has a bottom that lies essentially at the primary surface of the substrate;
   forming an electrical contact material in the reduced-bore third hole, fourth hole, and over the polysilicon layer; and
   etching away a portion of the electrical contact material and a portion of the polysilicon layer spaced from the third hole to form the contact having a bottom, wherein bottom of the contact contacts the substrate only at the doped region.

2. The method of claim 1 further comprising the step of:
   depositing a layer of titanium-containing material on the exposed portion of the doped region, along the sides of the reduced-bore third hole, the fourth hole, and over the polysilicon layer prior to the step of forming the electrical contact material.

3. The method of claim 1, wherein the insulating layer is at least three times thicker than the combined thickness.

4. The method of claim 2, wherein the sidewall spacer is polysilicon, and the method further comprises the step of removing the oxide layer before the step of depositing the titanium-containing material.

5. A method of forming a contact for a semiconductor device comprising the steps of:
   providing a substrate having a primary surface and a doped region that lies at the primary surface;
   forming a first layer over the substrate, wherein the first layer is an insulating layer;
   forming a second layer over the first layer, wherein the second layer includes a material selected from the group consisting of:
   polysilicon;
   titanium nitride;
   a material, which is capable of being etched by an etchant that is also capable of etching aluminum; and
   a material, which is capable of being etched with a chlorine-containing gas;
   forming a third layer over the second layer, wherein:
   the third layer is an insulating layer;
   a combination of the second and third layers has a combined thickness; and
   the first layer is thicker than the combined thickness;
   etching a first hole, which extends through the third layer;
   etching a second hole, which extends through the second layer and is aligned with the first hole, said second hole having a bore dimension;
   forming a sidewall spacer in the second hole to reduce the bore dimension within the second hole thereby forming a reduced-bore second hole, which lies within the second hole, wherein the sidewall spacer includes a material selected from a group consisting of polysilicon and titanium nitride;
   etching a third hole, wherein the third hole; is aligned with the bottom of the reduced-bore second hole; extends through the first layer to the doped region; and has a bottom that lies essentially at the primary surface of the substrate;

forming an electrical contact material in the reduced-bore second hole, the third hole, and over the second layer; and etching away a portion of the electrical contact material and a portion of the second layer spaced from the second hole to form the contact having a bottom, wherein the bottom of the contact contacts the substrate only at the doped region.

6. The method of claim 5 further comprising the step of selectively etching the electrical contact material and the second layer with a chlorine-containing gas.

7. The method of claim 6 wherein the chlorine-containg gas comprises chlorine, silicon tetrachloride, and boron trichloride.

8. The method of claim 6 wherein the chlorine-containing gas comprises at least one of chlorine, silicon tetrachloride, and boron trichloride.

9. The method of claim 5, wherein the first layer is at least three times thicker than the combined thickness.

10. The method of claim 5, wherein the second layer and the sidewall spacer are polysilicon, and the method further comprises the step of removing the third layer before the step of forming the electrical contact material.

11. A method of forming a contact for a semiconductor device comprising the steps of:

forming a patterned first layer over a substrate, wherein the patterned first layer has first and second surfaces that lie on opposite sides of the patterned first layer, and wherein the first surface is further from the substrate compared to the second surface;

forming a second layer on the patterned first layer;

forming a third layer on the second layer, wherein the second layer includes a material selected from a group consisting of polysilicon;

titanium nitride;

a material, which is capable of being etched by an etchant that is also capable of etching aluminum; and a material, which is capable of being etched with a chlorine-containing gas;

forming a fourth layer on the third layer, wherein a combination of the third and fourth layers has a combined thickness, and wherein the second layer is thicker than the combined thickness;

patterning the fourth and third layers to form a first hole;

forming a sidewall spacer in the first hole to reduce the bore dimension within the first hole thereby forming a reduced-bore first hole, which lies within the first hole, wherein the sidewall spacer:

includes a material selected from a group consisting of polysilicon and titanium nitride; and is formed prior to forming any other layer after the step of patterning the third and fourth layers and prior to etching a hole in the second layer;

etching a second hole, wherein the second hole:

extends through the second layer to the first layer;

is aligned with the bottom of the reduced-bore first hole; and has a bottom that lies essentially at the first surface of the first layer;

forming an electrical contact material in the reduced-bore first hole, the second hole, and over said second layer; and etching away a portion of the electrical contact material and a portion of the third layer spaced from the first hole to form the contact having a bottom, wherein the bottom of the contact contacts only the first layer.

12. The method of claim 11, wherein:

the patterned first layer acts as a gate electrode and includes polysilicon; and each of the second and fourth layers consist of an insulating material.

13. The method of claim 11, wherein the second layer is at least three times thicker than the combined thickness.

14. The method of claim 11, wherein virtually none of the fourth layer is etched during the step of forming the sidewall spacer.

15. The method of claim 11, wherein the third layer and the sidewall spacer are polysilicon, and wherein the method further comprises the step of removing the fourth layer before the step of forming the electrical contact material.

* * * * *